United States Patent
Kurra et al.

(10) Patent No.: US 11,131,711 B1
(45) Date of Patent: Sep. 28, 2021

(54) TESTING SYSTEM AND METHOD FOR IN CHIP DECOUPLING CAPACITOR CIRCUITS

(71) Applicant: NVIDIA Corporation, Santa Clara, CA (US)

(72) Inventors: Krishnamraju Kurra, Santa Clara, CA (US); Gunaseelan Ponnuvel, San Jose, CA (US); Divyesh Shah, Fremont, CA (US); Abhishek Akkur, San Jose, CA (US); Kartik Joshi, Santa Clara, CA (US); Tezaswi Raja, San Jose, CA (US); Andy Chamas, San Francisco, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 16/936,264

(22) Filed: Jul. 22, 2020

(51) Int. Cl.
| | |
|---|---|
| G01R 31/00 | (2006.01) |
| G01R 31/317 | (2006.01) |
| H01L 27/02 | (2006.01) |
| G01R 31/3177 | (2006.01) |
| H01L 23/58 | (2006.01) |

(52) U.S. Cl.
CPC ... *G01R 31/31702* (2013.01); *G01R 31/3177* (2013.01); *G01R 31/31713* (2013.01); *H01L 23/58* (2013.01); *H01L 27/0203* (2013.01)

(58) Field of Classification Search
CPC ........ G01R 31/31702; G01R 31/31713; G01R 31/3177; H01L 23/58; H01L 27/0203
See application file for complete search history.

(56) References Cited

U.S. PATENT DOCUMENTS

| | | | | |
|---|---|---|---|---|
| 5,506,457 A | * | 4/1996 | Krauter | H01L 27/0805 307/129 |
| 6,307,250 B1 | * | 10/2001 | Krauter | H01L 27/0805 257/532 |
| 6,844,771 B1 | * | 1/2005 | Chen | H01L 27/0203 327/379 |
| 6,949,967 B2 | * | 9/2005 | Wang | H03J 1/0008 327/337 |
| 8,009,398 B2 | * | 8/2011 | Agarwal | H01L 22/22 361/56 |
| 8,493,075 B2 | * | 7/2013 | Feng | H03K 19/00369 324/613 |
| 2002/0081832 A1 | * | 6/2002 | Bernstein | H01L 23/5223 438/621 |

* cited by examiner

*Primary Examiner* — Kurtis R Bahr
(74) *Attorney, Agent, or Firm* — Zilka-Kotab, P.C.

(57) ABSTRACT

In-chip decoupling capacitor circuits refer to decoupling capacitors (DCAPs) that are placed on a chip. These DCAPs are generally used to manage power supply noise for the chip, and can be utilized individually or as a distributed system. In some cases, DCAPs may make up a significant portion of the chip. Unfortunately, defects in DCAPs will degrade over time, will encroach into active logic, and will further cause automatic test pattern generation (ATPG) failure. To date, there has been a lack of structural test coverage for DCAP circuits, which reduces test coverage of the chip as a whole. To this end, defects on the chip as they relate to DCAPs (i.e. shorts in the DCAP) may not be detected. The present disclosure provides a structural test system and method for DCAPs and other passive logic components located on-chip.

20 Claims, 11 Drawing Sheets

TESTING SYSTEM AND METHOD FOR IN CHIP DECOUPLING CAPACITOR CIRCUITS

TECHNICAL FIELD

The present disclosure relates to in chip decoupling capacitor circuits.

BACKGROUND

In-chip decoupling capacitor circuits refer to decoupling capacitors (DCAPs) that are placed on a chip. These DCAPs are generally used to manage power supply noise for the chip, and can be utilized individually or as a distributed system. In some cases, DCAPs may make up a significant portion of the chip. Unfortunately, defects in DCAPs will degrade over time, will encroach into active logic, and will further cause functional failure.

To date, there has been a lack of structural test coverage for DCAP circuits or other on-die passive logic components, which reduces test coverage of the chip as a whole. To this end, defects on the chip as they relate to DCAPs (i.e. shorts in the DCAP) may not be detected. There is a need for addressing these issues and/or other issues associated with the prior art.

SUMMARY

A structural test method and system are disclosed for in chip decoupling capacitor circuits. In one embodiment, a circuit comprises a plurality of passive logic components located on-chip. The circuit also comprises a plurality of first dummy conductors (e.g. polys) connected to form at least one first block that is tied to a pull up point, and a plurality of second dummy conductors connected to form at least one second block that is tied to a pull down point. Each end of each passive logic component of the plurality of passive logic components has attached thereto a respective first dummy conductor of the plurality of first dummy conductors and a respective second dummy conductor of the plurality of second dummy conductors. Further, the circuit comprises test logic connected to the pull up point and the pull down point, wherein the test logic is configured to detect defects associated with the plurality of passive logic components based on respective values of the pull up point and the pull down point.

DETAILED DESCRIPTION

Figure 1:
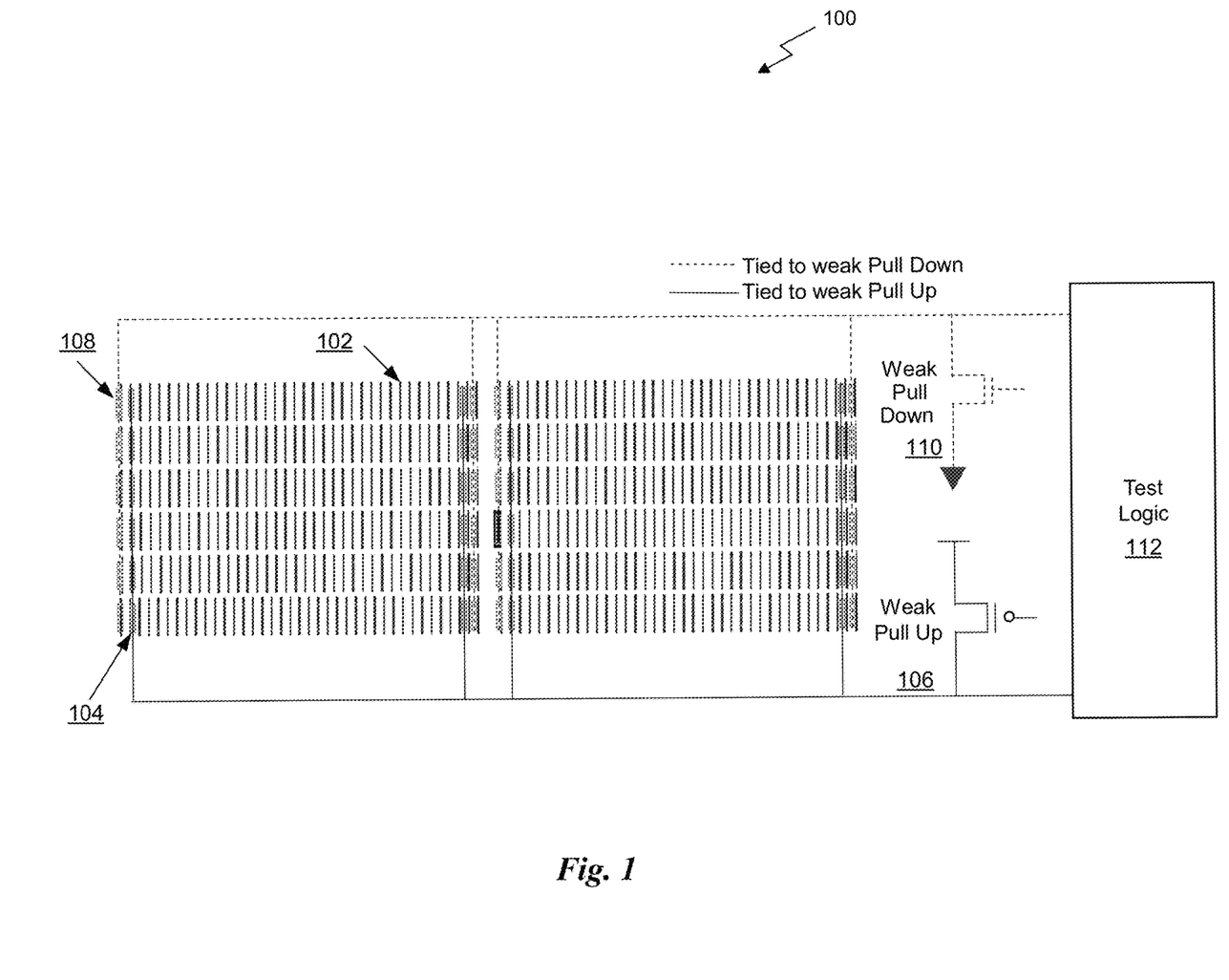
FIG. 1 illustrates a circuit for testing passive logic components located on-chip, in accordance with an embodiment.

FIG. 1 illustrates a circuit 100 for testing passive logic components located on-chip, in accordance with an embodiment. As shown, the circuit 100 comprises a plurality of passive logic components 102 located on-chip. The chip may be a computer processor or any integrated circuit having the components described with respect to the present embodiment. The passive logic components 102 may be arranged on the chip as a mesh (e.g. grid). For example, in the embodiment shown, the passive logic components 102 may be arranged in two columns of six (i.e. 6×2). The passive logic components 102 may be used to manage power supply noise for the chip.

It should be noted that the passive logic components 102 may be any logic components that are passive in a current operating state of the chip. In one embodiment, the logic components 102 may be passive (i.e. non-functional) when powered down. In this embodiment, the logic components 102 may be active (i.e. functional) when powered up.

In another embodiment, the logic components 102 may be passive no matter the current operating state of the chip. For example, the passive logic components may include non-functional logic. As another example, with respect to this embodiment the logic components 102 may be decoupling capacitors (DCAPs).

As also shown, the circuit 100 comprises a plurality of first dummy (e.g. floating) conductors 104 connected to form at least one first block that is tied to a pull up point 106, and a plurality of second dummy (e.g. floating) conductors 108 connected to form at least one second block that is tied to a pull down point 110. The conductors may each be poly, metal, or any other conductive material. While the first dummy conductors 104 are shown as being connected together to form a single block that is tied to the pull up point 106, in another embodiment (not shown) different portions of the first dummy conductors 104 may be connected together to form different blocks that are each tied to a different pull up point. Similarly, while the second dummy conductors 108 are shown as being connected together to form a single block that is tied to the pull down point 110, in another embodiment (not shown) different portions of the second dummy conductors 108 may be connected together to form different blocks that are each tied to a different down up point.

Further, as shown, each end of each passive logic component 102 has attached thereto a respective first dummy conductor 104 and a respective second dummy conductor 108. In one embodiment, the pull up point 106 pulls a signal from the at least one first block of first dummy conductors 104 to a first value (e.g. the value 1) and the pull down point 110 pulls a signal from the at least one second block of second dummy conductors 108 to a second value (e.g. the value 0). The pull up point 106 and the pull down point 110 are used to sense a voltage associated with the respective blocks of dummy conductors and in turn the passive logic components 102. In the embodiment shown, the pull up point 106 and the pull down point 110 are weak. Other embodiments are considered, as described below, where the pull up point 106 and the pull down point 110 may be strong.

Further, the circuit 100 comprises test logic 112 connected to the pull up point 106 and the pull down point 110. The test logic 112 is configured to detect defects associated with the plurality of passive logic components 102 based on respective values of the pull up point 106 and the pull down point 110. In one embodiment, the test logic 112 may be configured to detect the defects by detecting shorts associated with the plurality of passive logic components 102.

Where the circuit 100 comprises multiple pull up points and multiple pull down points, as described above, the test logic 112 may be connected to all such pull up and pull down points. In this embodiment (not shown), the test logic 112 may detect defects associated with each block of passive logic components 102 based on values of the respective pull up and pull down points, in the same manner as described above.

To this end, the circuit 100 is configured such that the passive logic components 102 are attached to the dummy conductor blocks which are in turn connected to respective pull up and pull down points 106, 110. The test logic 112 uses the values of the pull up and pull down points 106, 110 to detect defects associated with the passive logic components 102. This circuit 100 configuration therefore provides structural testing of the passive logic components 102, thus providing test coverage of the portion of the chip having the passive logic components 102.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

For example, while some of the embodiments described below may reference specifically DCAPs, it should be noted that these embodiments may equally apply to other types of passive logic components. As another example, while some of the embodiments described below may reference specifically polys, it should be noted that other types of conductors may equally apply.

Figure 2:
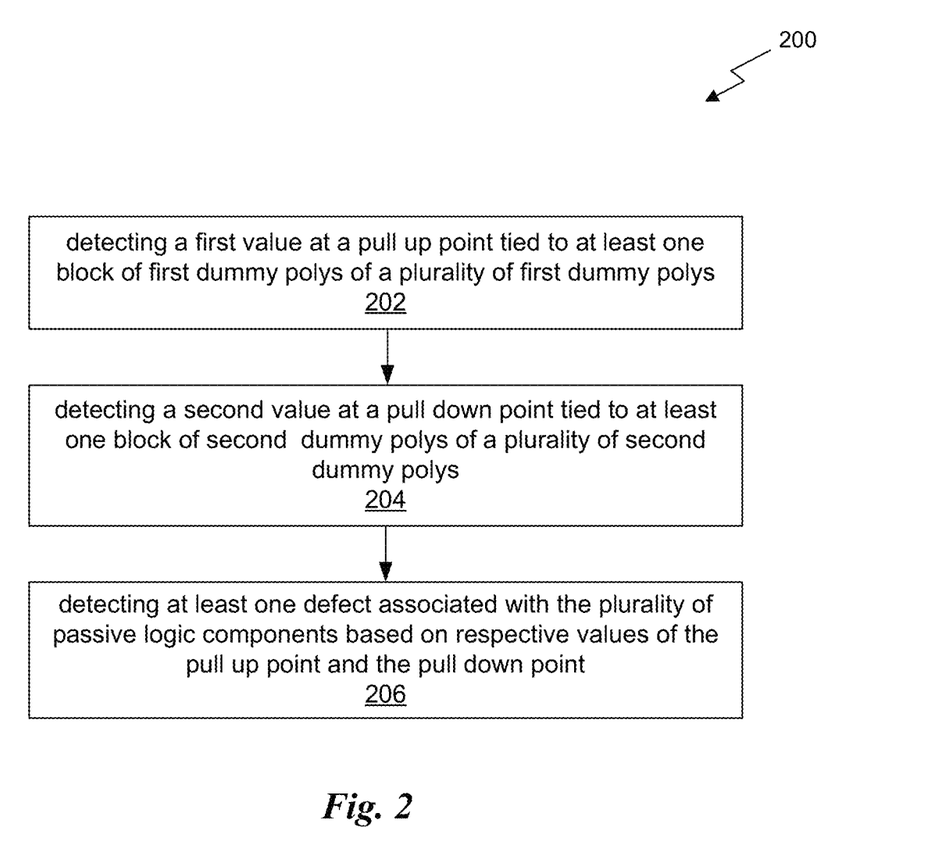
FIG. 2 illustrates a flowchart of a method for testing passive logic components located on-chip, in accordance with an embodiment.

FIG. 2 illustrates a flowchart of a method 200 for testing passive logic components located on-chip, in accordance with an embodiment. The method 200 may be performed using the circuit 100 of FIG. 1, in one embodiment. In particular, with respect to the present embodiment, a plurality of passive logic components are located on-chip, and each passive logic component has attached thereto a respective first dummy poly of a plurality of first dummy polys and a respective second dummy poly of a plurality of second dummy polys.

In operation 202, a first value is detected at a pull up point tied to at least one block of the first dummy polys. Additionally, in operation 204, a second value is detected at a pull down point tied to at least one block of second dummy polys. Further, as shown in operation 206, at least one defect associated with the plurality of passive logic components is detected based on respective values of the pull up point and the pull down point. In one embodiment, the defect may be detected from a change in the first value of the pull up point or a change in the second value of the pull down point. For example, the defect may be detected by a short between two dummy polys of the first dummy polys and/or the second dummy polys.

In one embodiment, the method 200 may be implemented during a production test mode of operation of the chip. For example, the chip may operate test logic in the production test mode. The production test mode may refer to a mode in which the passive logic components are tested during normal operation of the chip (e.g. to identify failures occurring during normal operation of the chip).

In another embodiment, the method 200 may be implemented during a characterization mode of operation of the chip. For example, the chip may operate test logic in the characterization mode. The characterization mode may refer to a mode in which the passive logic components are tested to characterize the chip (i.e. with respect to any failures caused by defects resulting from manufacture of the chip). During the characterization mode of operation, a short may be induced in association with the plurality of passive logic components.

As an option, at least one additional defect associated with the plurality of passive logic components may be detected, independently of detecting the at least one defect associated with the plurality of passive logic components. This additional defect may be detected during a separate test mode of the test logic, as an option. In one embodiment, the additional defect may be detected by a supply voltage being shorted to ground. In another embodiment, the additional defect may be detected by ground being shorted to the supply voltage.

In this way, the method 100 may be implemented, for example by the test logic 112 of FIG. 1, for detecting defects in the passive logic components. As noted above, these defects may cause shorts between the passive logic components and/or shorts between the supply voltage and ground.

Figure 3:
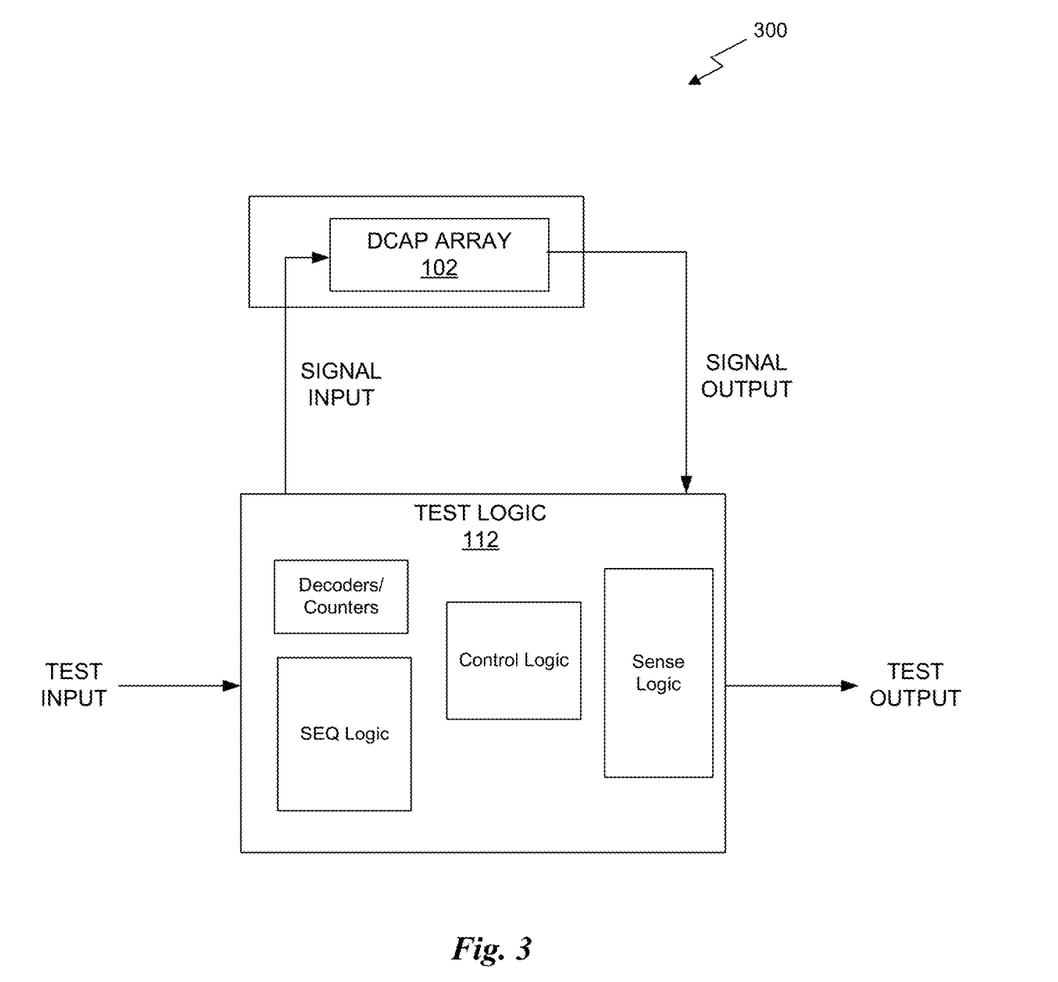
FIG. 3 illustrates a block diagram showing the inputs and outputs of the circuit of FIG. 1, in accordance with an embodiment.

FIG. 3 illustrates a block diagram 300 showing the inputs and outputs of the circuit 100 of FIG. 1, in accordance with an embodiment. The inputs and outputs are described in Table 1 below.

As shown, the testing logic 112 receives test input that controls operation of the testing logic 112. The test input may be a DCAP_CFG [2:0] input, a CLK input, a RESET input, or a SPARE_IN input. Based on the test input received by the testing logic 112, the testing logic 112 provides as input to the DCAPs a DCAP_TEST_OUT_HIGH input or a DCAP_TEST_OUT_LOW input. In response, the pull up point and/or pull down point outputs to the testing logic 112 a DCAP_SENSE_IN_HIGH output or a DCAP_SENSE_IN_LOW output. The testing logic 112 processes the pull up point and/or pull down point outputs and generates a DCAP_TEST_OUT output, which indicates any defects associated with the DCAPs.

TABLE 1

| Pin | Type | In/Out | Description |
| --- | --- | --- | --- |
| DCAP_CFG [2:0] | Bus | In | Test select bits |
| CLK | Signal | In | Clock in |
| RESET | Signal | In | Reset in |
| SPARE_IN | Signal | In | Spare input |
| DCAP_SENSE_IN_LOW | Signal | In | Sense low input |
| DCAP_SENSE_IN_HIGH | Signal | In | Sense high input |
| DCAP_TEST_OUT_LOW | Signal | Out | Tie low output |
| DCAP_TEST_OUT_HIGH | Signal | Out | Tie high output |
| DCAP_TEST_OUT | Signal | Out | Sticky fault bit |

Figure 4:
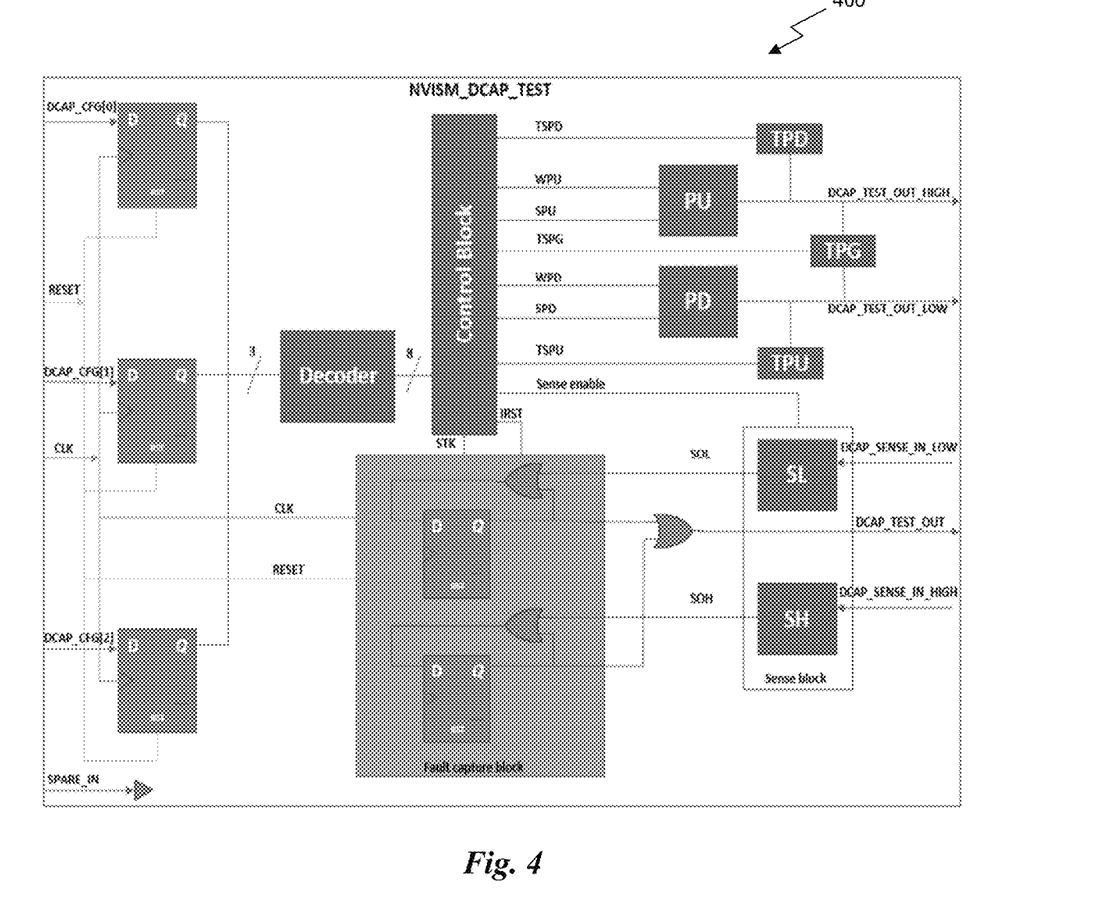
FIG. 4 illustrates a circuit diagram of the testing logic of FIG. 1, in accordance with an embodiment.

FIG. 4 illustrates a circuit diagram 400 of the testing logic 112 of FIG. 1, in accordance with an embodiment. The internal block components of the testing logic 112 circuit are described in Table 2 below.

TABLE 2

| Internal Block | Description |
| --- | --- |
| PU | Pull up (tie high) circuit |
| PD | Pull down (tie low) circuit |
| TPD | Test pull down |
| TPU | Test pull up |
| TPG | Test pass gate |
| SL | Sense Low |
| SH | Sense High |

The internal pin signals of the testing logic 112 circuit are described in Table 3 below.

TABLE 3

| Internal Pin | Description |
| --- | --- |
| TSPD | Test strong pull down |
| WPU | Weak pull up |
| TSPG | Test strong (nmos) pass gate |
| WPD | Weak pull down |
| SPU | Strong pull up |
| SPD | Strong pull down |
| Sense enable | Sensing enable (active high) |
| SOL | Sense out low |
| STK | Stuck at fault check |
| IRST | Internal reset |
| SOH | Sense out high |

As shown, the pull up (PU) and pull down (PD) points may be tied to a strong or weak signal, depending on the operation mode of the testing logic 112. This defines the threshold by which a change in voltage is detected by the testing logic 112.

Table 4 illustrates the operating modes of the testing logic 112.

Stuck at test (7): Test stuck at '0' fault on DCAP_TEST_OUT

Figure 5:
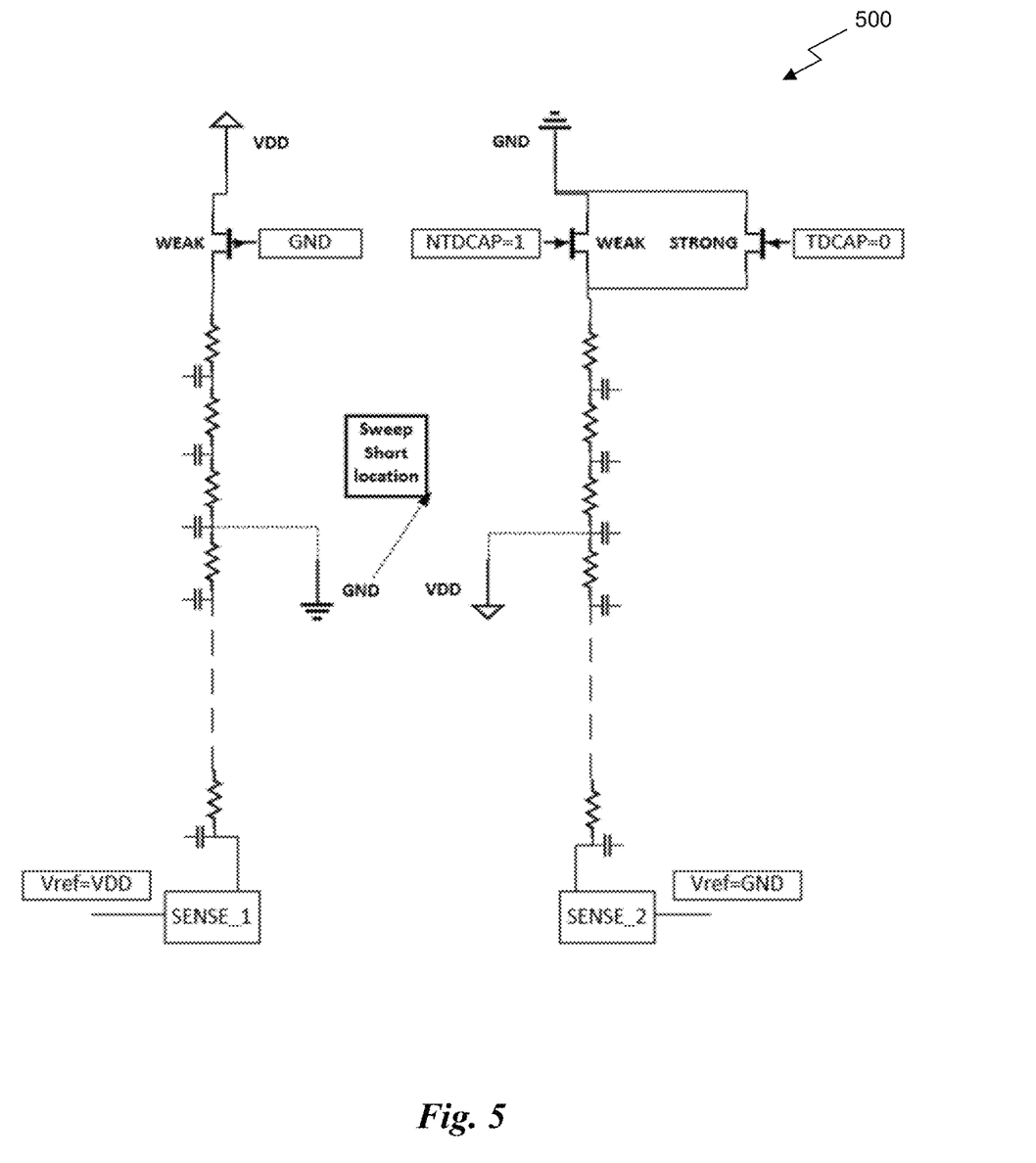
FIG. 5 illustrates a circuit diagram including both strong and weak pulls used to sense voltage in association with a plurality of DCAPs, in accordance with an embodiment.

FIG. 5 illustrates a circuit diagram 500 including both strong and weak pulls used to sense voltage in association with a plurality of DCAPs, in accordance with an embodiment.

The modes may detect different shorts, as shown in Table 4 below. In particular, while the normal mode may not detect shorts (i.e. faults), the remaining modes may detect a short between dummy polys, a supply voltage shorted to ground, and ground shorted to the supply voltage.

TABLE 5

| MODE | T_DCAP | NT_DCAP | SENSE_1 | SENSE2 | FAULT |
| --- | --- | --- | --- | --- | --- |
| NORMAL | 1 | 0 | 1 | 0 | NO |
| POLY_SHORT | 1 | 0 | 0 | 0 | YES |
| VDD_SHORT | 0 | 1 | 1 | 1 | YES |
| GND_SHORT | 0 | 1 | 0 | 0 | YES |

Figure 6:
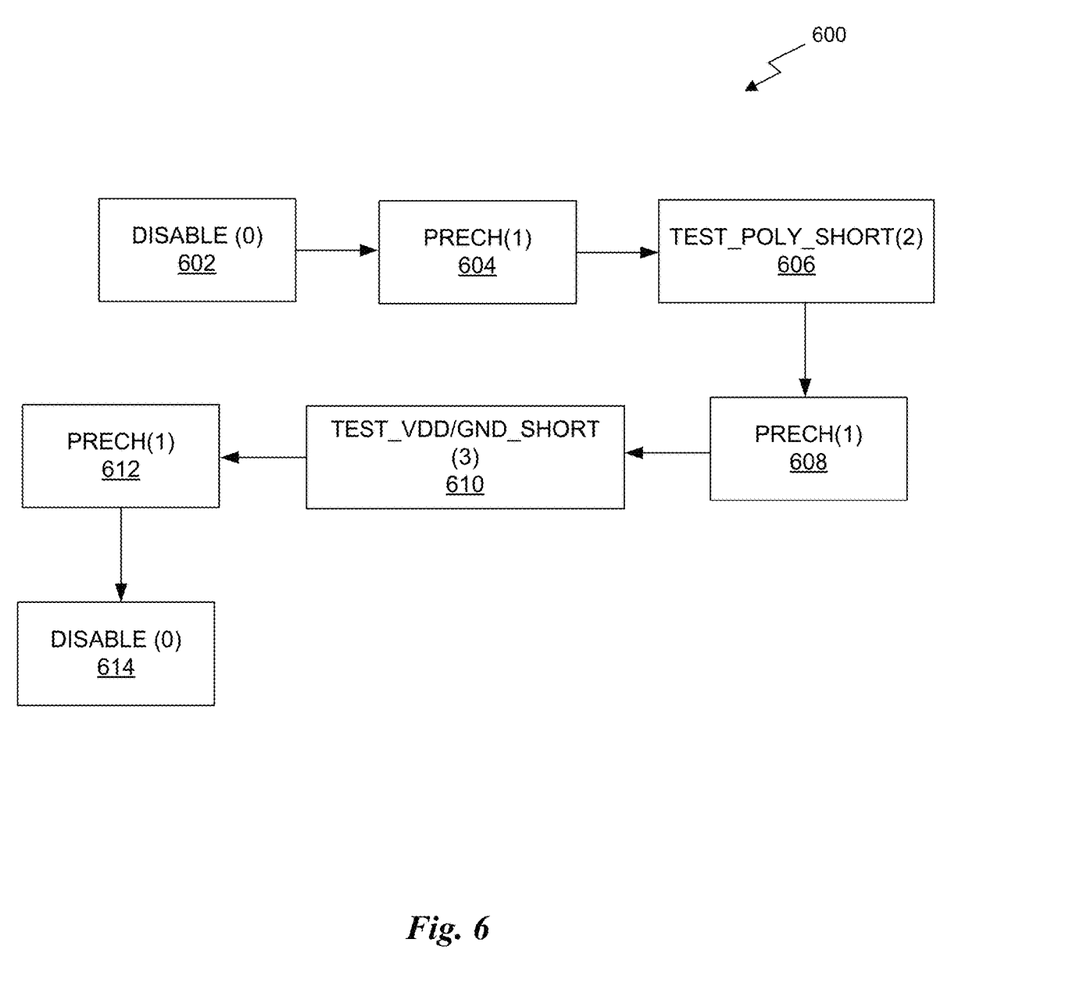
FIG. 6 illustrates a flowchart of a method for testing passive logic components located on-chip during a production test mode of operation of the chip, in accordance with an embodiment.

FIG. 6 illustrates a flowchart of a method 600 for testing passive logic components located on-chip during a production test mode of operation of the chip, in accordance with an embodiment.

As shown, in operation 602 a disable operation is performed. This disables the ISM by turning off all the pull-up and pull-down circuitry. This also generates an internal reset (IRST) which overrides external RESET and ties DCAP_TEST_OUT to low.

Next, in operation 604, a precharge operation is performed. This precharges DCAP_TEST_OUT_HIGH and discharges DCAP_TEST_OUT_LOW nets.

Additionally, in operation 606, a test for shorts between dummy polys is run. This test is run during a functional mode of operation of the chip.

TABLE 4

| DCAP_CFG | TEST | CHAR | MODE | WPU | WPD | SPU | SPD | SENSE | TSPU | TSPD |
| --- | --- | --- | --- | --- | --- | --- | --- | --- | --- | --- |
| 0 | N/A | N/A | DISABLE | 1 | 0 | 1 | 0 | 0 | 1 | 0 |
| 1 | NO | NO | PRECHARGE | 0 | 1 | 0 | 1 | 0 | 1 | 0 |
| 2 | YES | NO | TEST_POLY_SHORT | 0 | 0 | 1 | 1 | 1 | 1 | 0 |
| 3 | | | TEST_VDD_SHORT | 0 | 1 | 1 | 0 | 1 | 1 | 0 |
| | | | TEST_GND_SHORT | 0 | 1 | 1 | 0 | 1 | 1 | 0 |
| 4 | NO | YES | CHAR_POLY_SHORT | 0 | 0 | 1 | 1 | 1 | 1 | 0 |
| 5 | | | CHAR_VDD_SHORT | 0 | 1 | 1 | 0 | 1 | 0 | 0 |
| 6 | | | CHAR_GND_SHORT | 0 | 1 | 1 | 0 | 1 | 1 | 1 |
| 7 | | | STUCK_AT_TEST | 1 | 0 | 1 | 0 | 0 | 1 | 0 |

| DCAP_CFG | TEST | CHAR | MODE | TSPG | IRST | STK | SOH | SOL | DCAP_TEST_OUT |
| --- | --- | --- | --- | --- | --- | --- | --- | --- | --- |
| 0 | N/A | N/A | DISABLE | 0 | 1 | 0 | 0 | 0 | 0 |
| 1 | NO | NO | PRECHARGE | 0 | 0 | 0 | 0 | 0 | 0 |
| 2 | YES | NO | TEST_POLY_SHORT | 0 | 0 | 0 | 1 | 0 | 1 |
| 3 | | | TEST_VDD_SHORT | 0 | 0 | 0 | 0 | 1 | 1 |
| | | | TEST_GND_SHORT | 0 | 0 | 0 | 1 | 0 | 1 |
| 4 | NO | YES | CHAR_POLY_SHORT | 1 | 0 | 0 | 1 | X | 1 |
| 5 | | | CHAR_VDD_SHORT | 0 | 0 | 0 | X | 1 | 1 |
| 6 | | | CHAR_GND_SHORT | 0 | 0 | 0 | 1 | X | 1 |
| 7 | | | STUCK_AT_TEST | 0 | 0 | 1 | 0 | 0 | 1 |

Disable (0): This disables the In Silicon Measurement (ISM) by turning off all the pull-up and pull-down circuitry. This also generates an internal reset (IRST) which overrides external RESET and ties DCAP_TEST_OUT to low.

Precharge (1): This mode precharges DCAP_TEST_OUT_HIGH and discharges DCAP_TEST_OUT_LOW nets.

Test Modes(2,3): Functional modes POLY/VDD/GND short

Char modes(4,5,6): Characterization modes

Further, in operation 608, a precharge operation is performed. This is performed after the test in operation 606 is completed.

In operation 610, a test for shorts between the source voltage and ground is run. This test is run during the functional mode of operation of the chip.

Next, in operation 612, a precharge operation is performed. Again, this is performed after the test in operation 610 is completed.

Finally, in operation 614, a disable operation is performed.

Figure 7:
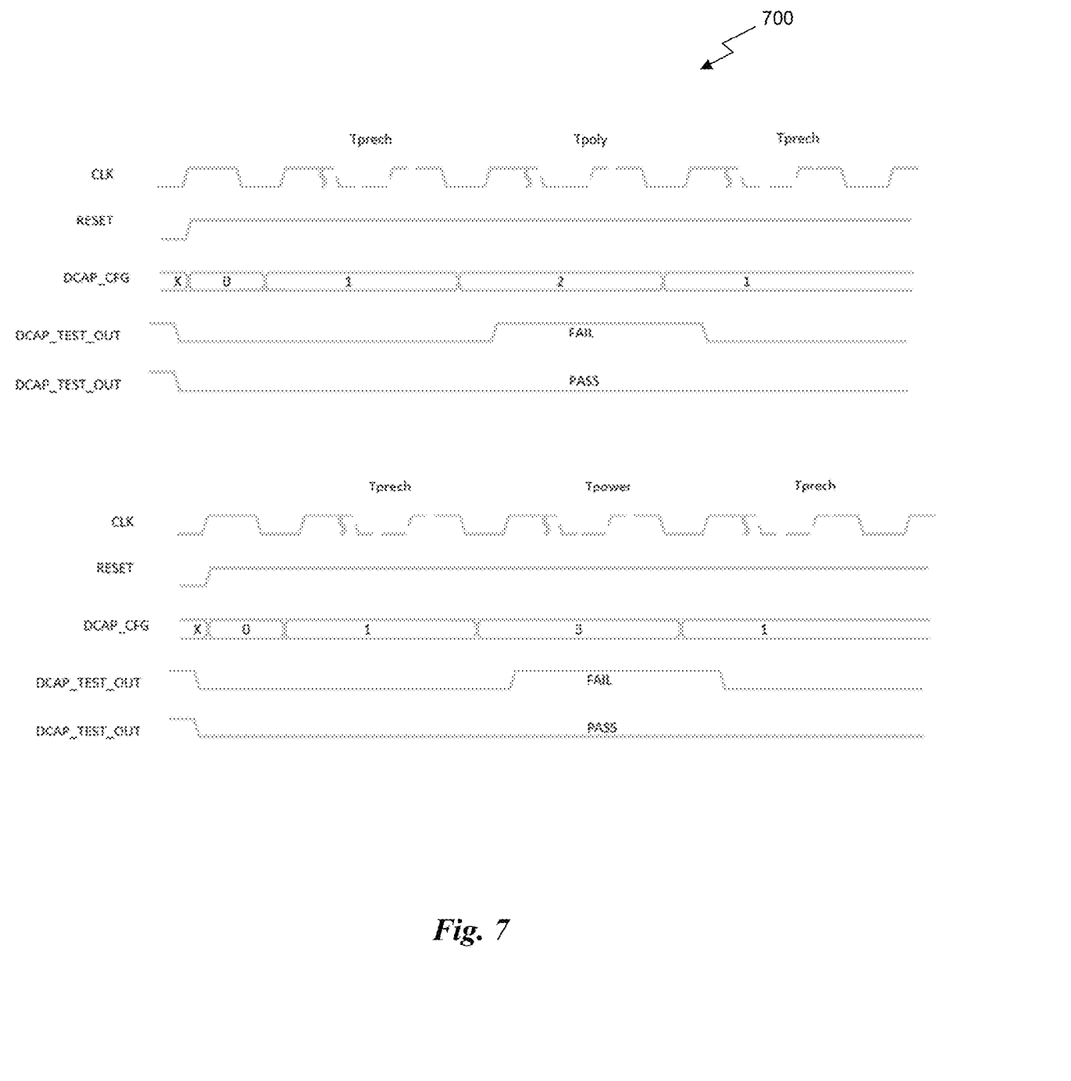
FIG. 7 illustrates an exemplary timing diagram for the flowchart of FIG. 6, in accordance with an embodiment.

FIG. 7 illustrates an exemplary timing diagram 700 for the flowchart of FIG. 6, in accordance with an embodiment.

It should be noted that in the exemplary embodiment shown, the DCAP_TEST_OUT waveform is shown in two states, each indicating a pass and fail respectively. This is for illustrative purposes only, and during execution only one of such waveforms will be present (i.e. depending on the pass/fail state of the test output).

Table 6 illustrates the possible waveform states for the production test.

TABLE 6

| DCAP_CFG | TEST | MODE | DCAP_TEST_OUT PASS | FAIL |
|---|---|---|---|---|
| 0 | N/A | DISABLE | 0 | 1 |
| 1 | NO | PRECHARGE | 0 | 1 |
| 2 | YES | TEST_POLY_SHORT | 0 | 1 |
|   |   | TEST_VDD_SHORT | 0 | 1 |
| 3 |   | TEST_GND_SHORT | 0 | 1 |

Table 7 illustrates the duration of the various operations shown in the timing diagram 700.

TABLE 7

| DCAP_CFG | TEST | MODE | mode | Duration |
|---|---|---|---|---|
| 0 | N/A | DISABLE | Tdisable | at least 0.5 us |
| 1 | NO | PRECHARGE | Tprech | at least 0.5 us |
| 2 | YES | TEST_POLY_SHORT | Tpoly | at least 0.5 us |
| 3 |   | TEST_VDD_SHORT | Tpower | at least 0.5 us |
|   |   | TEST_GND_SHORT | Tpower | at least 0.5 us |

Figure 8:
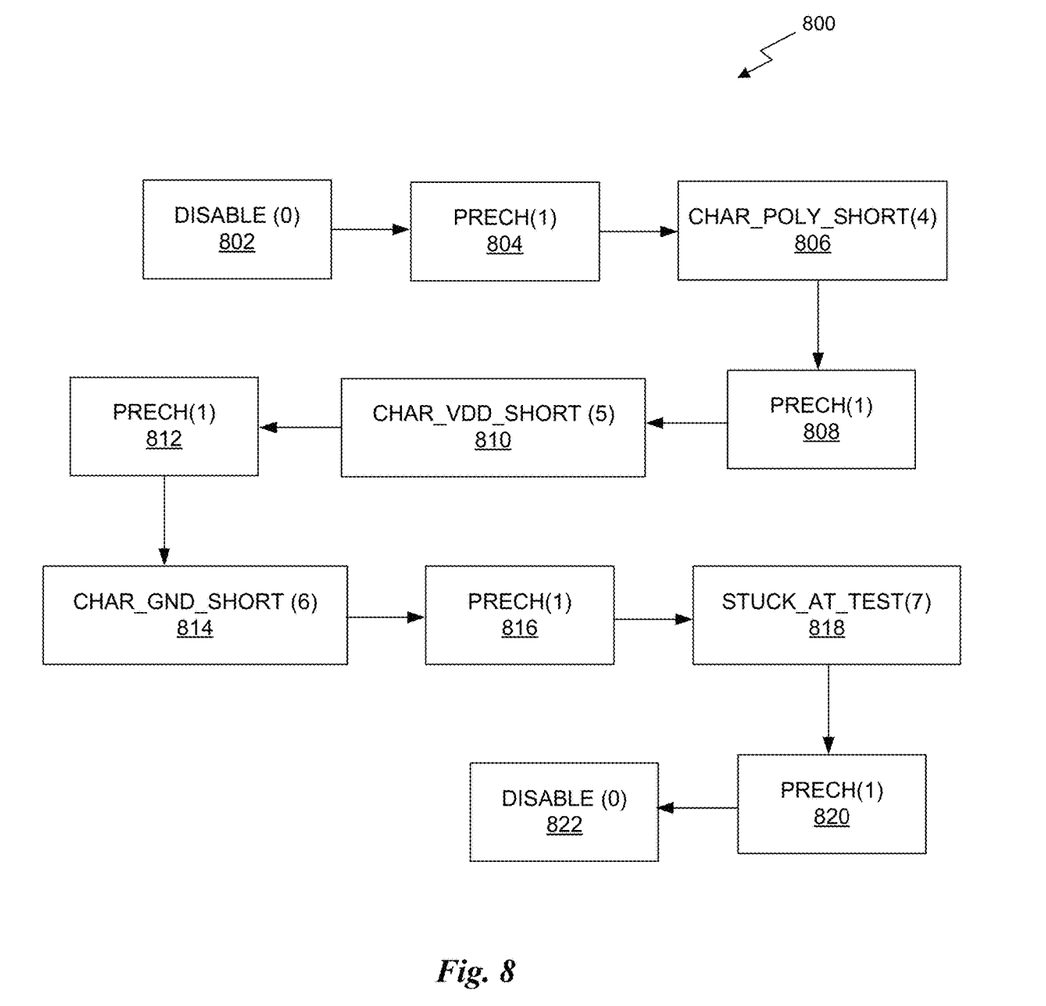
FIG. 8 illustrates a flowchart of a method for testing passive logic components located on-chip during a characterization mode of operation of the chip, in accordance with an embodiment.

FIG. 8 illustrates a flowchart of a method 800 for testing passive logic components located on-chip during a characterization mode of operation of the chip, in accordance with an embodiment.

As shown, in operation 802 a disable operation is performed. This disables the ISM by turning off all the pull-up and pull-down circuitry. This also generates an internal reset (IRST) which overrides external RESET and ties DCAP_TEST_OUT to low.

Next, in operation 804, a precharge operation is performed. This precharges DCAP_TEST_OUT_HIGH and discharges DCAP_TEST_OUT_LOW nets.

Additionally, in operation 806, a characterization for shorts between dummy polys is performed. This characterization may be a test that is run during a characterization mode of operation associated with the chip (i.e. to characterize the DCAPs as defective or not).

Further, in operation 808, a precharge operation is performed. This is performed after the characterization in operation 806 is completed.

In operation 810, a characterization of the source voltage being shorted to ground is performed. This characterization is run during the characterization mode of operation associated with the chip.

Next, in operation 812, a precharge operation is performed. Again, this is performed after the characterization in operation 810 is completed.

In operation 814, a characterization of the ground being shorted to the source voltage is performed. This characterization is run during the characterization mode of operation associated with the chip.

Next, in operation 816, a precharge operation is performed. Again, this is performed after the characterization in operation 814 is completed.

Further, in operation 818, a stuck at test operation is performed. This tests whether the test logic output is stuck at the value '0' (indicating a fault).

After the stuck at test operation, a precharge operation is performed in operation 820.

Finally, in operation 822, a disable operation is performed.

Figure 9:
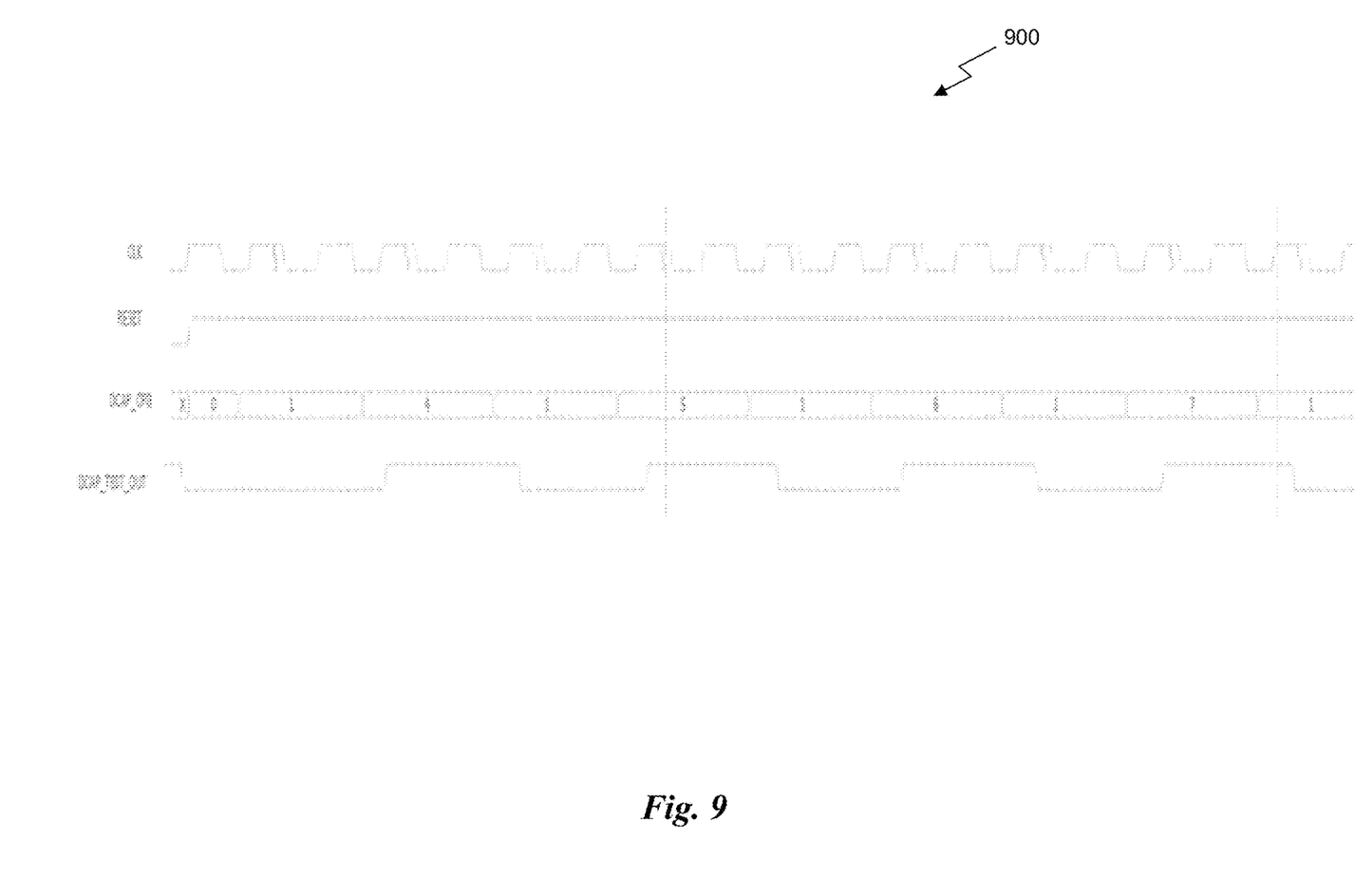
FIG. 9 illustrates an exemplary timing diagram for the flowchart of FIG. 8, in accordance with an embodiment.

FIG. 9 illustrates an exemplary timing diagram 900 for the flowchart of FIG. 8, in accordance with an embodiment.

It should be noted that in the exemplary embodiment shown, the DCAP_TEST_OUT waveform is shown as indicating fail for each test/characterization shown in the flowchart of FIG. 8. This example is provided for illustrative purposes only.

Table 8 illustrates the possible waveform states for the characterization.

TABLE 8

| DCAP_CFG | CHAR | MODE | DCAP_TEST_OUT PASS | FAIL |
|---|---|---|---|---|
| 0 | N/A | DISABLE | 0 | 1 |
| 1 | NO | PRECHARGE | 0 | 1 |
| 4 | YES | CHAR_POLY_SHORT | 1 | 0 |
| 5 |   | CHAR_VDD_SHORT | 1 | 0 |
| 6 |   | CHAR_GND_SHORT | 1 | 0 |
| 7 |   | STUCK_AT_TEST | 1 | 0 |

Table 9 illustrates the duration of the various operations shown in the timing diagram 900.

TABLE 9

| DCAP_CFG | CHAR | MODE | mode | Duration |
|---|---|---|---|---|
| 0 | N/A | DISABLE | Tdisable | at least 0.5 us |
| 1 | NO | PRECHARGE | Tprech | at least 0.5 us |
| 4 | YES | CHAR_POLY_SHORT | Tchar | not more than 0.5 us |
| 5 |   | CHAR_VDD_SHORT | Tchar | not more than 0.5 us |
| 6 |   | CHAR_GND_SHORT | Tchar | not more than 0.5 us |
| 7 | YES | STUCK_AT_TEST | Tstuck | at least 0.5 us |

Figure 10A:
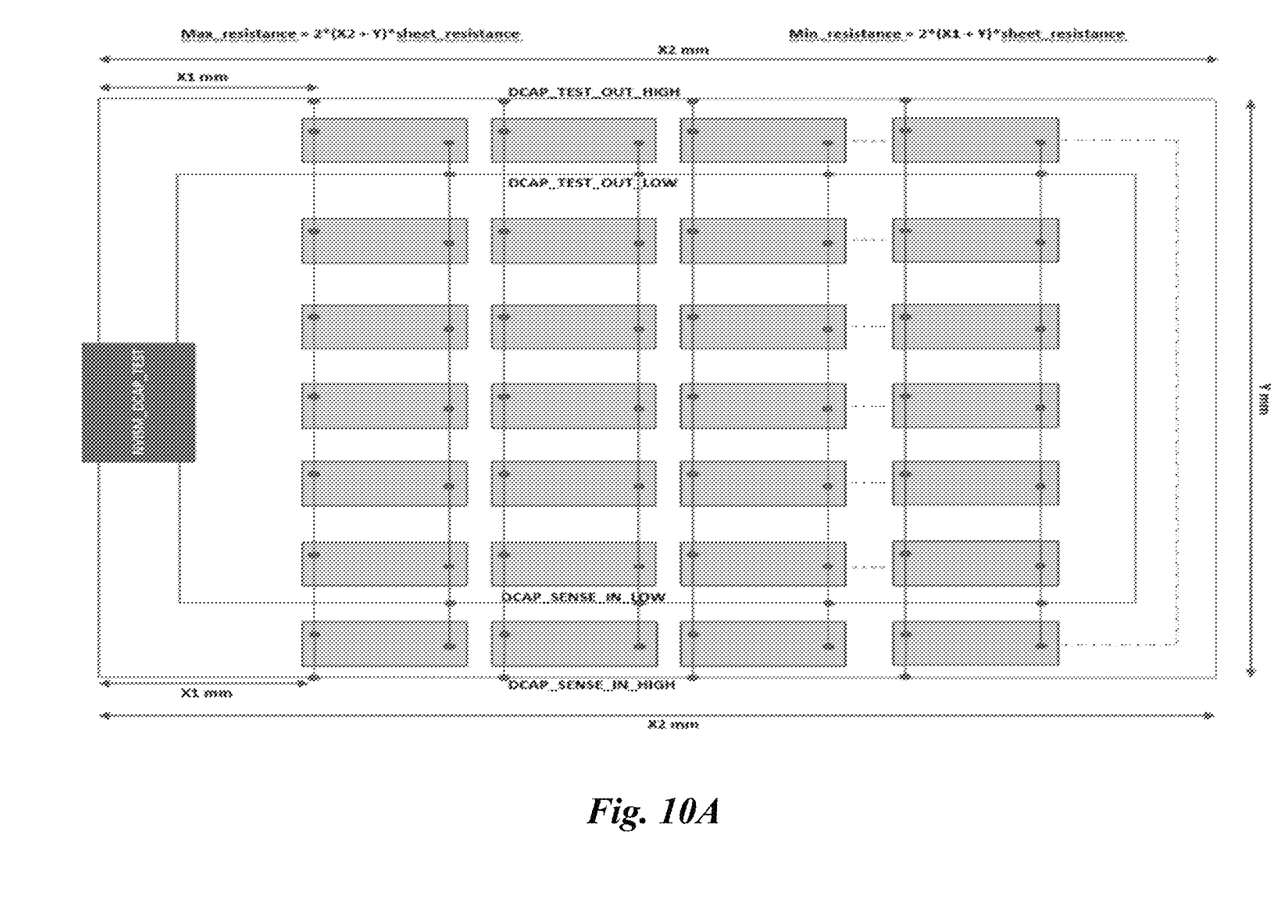
FIG. 10A illustrates a circuit diagram of an exemplary implementation of a mesh of DCAPs located on-chip and associated test logic, in accordance with an embodiment.

FIG. 10A illustrates a circuit diagram of an exemplary implementation of a mesh of DCAPs located on-chip and associated test logic, in accordance with an embodiment.

In the context of the exemplary implementation shown, the max wire length for the dummy polys is 2*(X+Y)=~1.5 mm. (Dcap_ISM dimensions negligible 11.424 um×11.76 um)

Figure 10B:
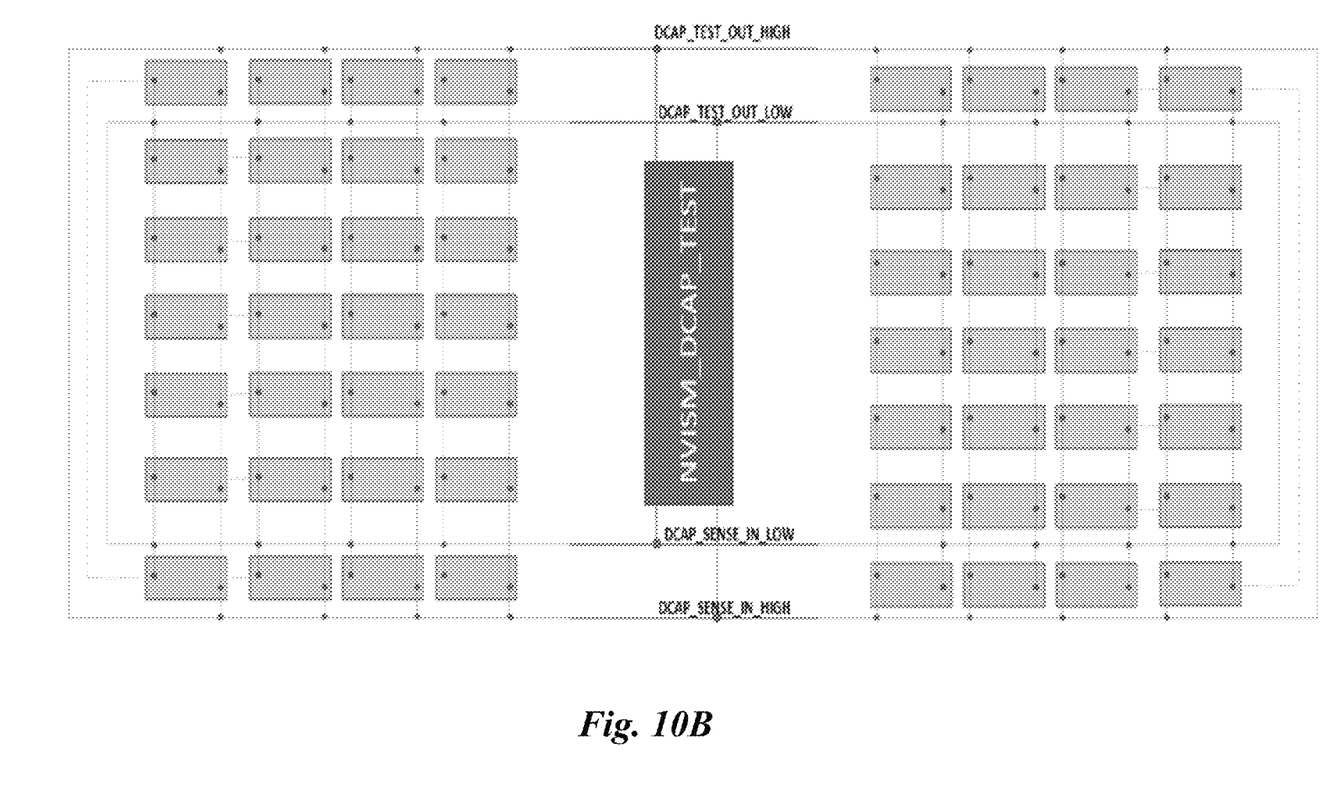
FIG. 10B illustrates a circuit diagram of another exemplary implementation of a mesh of DCAPs located on-chip and associated test logic, in accordance with an embodiment.

FIG. 10B illustrates a circuit diagram of another exemplary implementation of a mesh of DCAPs located on-chip and associated test logic, in accordance with an embodiment.

The exemplary implementation shows the Max and Min trace resistance and shortest path from DCAP_TEST_OUT_HIGH to DCAP_SENSE_IN_HIGH (and LOW). The DCAP coverage area is also shown, as well as the number of DCAPs connected per NVISM_DCAP_TEST instance.

What is claimed is:

1. A circuit, comprising:
a plurality of passive logic components located on-chip;
a plurality of first dummy conductors connected to form at least one first block that is tied to a pull up point from which a first value is detectable; and
a plurality of second dummy conductors connected to form at least one second block that is tied to a pull down point from which a second value is detectable;
wherein each end of each passive logic component of the plurality of passive logic components has attached thereto a respective first dummy conductor of the plurality of first dummy conductors and a respective second dummy conductor of the plurality of second dummy conductors; and
test logic connected to the pull up point and the pull down point, wherein the test logic is configured to detect defects associated with the plurality of passive logic components based on respective values of the pull up point and the pull down point.

2. The circuit of claim 1, wherein the passive logic components include non-functional logic.

3. The circuit of claim 1, wherein the passive logic components are decoupling capacitors (DCAPs).

4. The circuit of claim 1, wherein the passive logic components are powered down components that become active when powered up.

5. The circuit of claim 1, wherein the plurality of first dummy conductors are floating.

6. The circuit of claim 1, wherein the plurality of second dummy conductors are floating.

7. The circuit of claim 1, wherein the pull up point pulls a signal from the at least one first block to the value 1.

8. The circuit of claim 1, wherein the pull down point pulls a signal from the at least one second block to the value 0.

9. The circuit of claim 1, wherein the test logic is configured to detect defects associated with the plurality of passive logic components based on respective values of the pull up point and the pull down point by detecting shorts associated with the plurality of passive logic components.

10. A method, comprising:
detecting a first value at a pull up point tied to at least one block of first dummy conductors of a plurality of first dummy conductors;
detecting a second value at a pull down point tied to at least one block of second dummy conductors of a plurality of second dummy conductors;
wherein each end of each passive logic component of a plurality of passive logic components located on-chip has attached thereto a respective first dummy conductor of the plurality of first dummy conductors and a respective second dummy conductor of the plurality of second dummy conductors; and
detecting at least one defect associated with the plurality of passive logic components based on respective values of the pull up point and the pull down point.

11. The method of claim 10, wherein the detecting the at least one defect is performed during a production test mode of operation of the chip.

12. The method of claim 10, wherein the detecting the at least one defect is performed during a characterization mode of operation of the chip.

13. The method of claim 12, wherein during the characterization mode of operation, a short is induced in association with the plurality of passive logic components.

14. The method of claim 10, wherein the at least one defect is detected by a short between two dummy conductors of the first dummy conductors and/or the second dummy conductors.

15. The method of claim 10, The method of claim 1, further comprising:
detecting at least one additional defect associated with the plurality of passive logic components, independently of detecting the at least one defect associated with the plurality of passive logic components.

16. The method of claim 15, wherein the least one additional defect is detected by:
a supply voltage shorted to ground.

17. The method of claim 15, wherein the least one additional defect is detected by:
ground shorted to the supply voltage.

18. The method of claim 10, wherein the least one defect is detected from a change in the first value of the pull up point or a change in the second value of the pull down point.

19. The method of claim 10, wherein the pull up point and the pull down point are weak.

20. The method of claim 10, wherein the pull up point and the pull down point are strong.

* * * * *